United States Patent
Huggins et al.

(10) Patent No.: US 7,737,420 B2
(45) Date of Patent: Jun. 15, 2010

(54) PIXELATED MODULATION OF ILLUMINATION PUPIL IMAGE

(75) Inventors: Kevin Huggins, Beaverton, OR (US); Mark C. Phillips, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 535 days.

(21) Appl. No.: 11/694,932

(22) Filed: Mar. 30, 2007

(65) Prior Publication Data

US 2008/0237497 A1  Oct. 2, 2008

(51) Int. Cl.
  G21K 5/00  (2006.01)
  G21K 1/00  (2006.01)
  G02B 27/00  (2006.01)

(52) U.S. Cl. ............... 250/492.22; 250/505.1; 359/894

(58) Field of Classification Search ............ 250/492.1, 250/492.22, 503.1, 504 R, 505.1, 370.08, 250/372, 365, 461.1; 359/894, 850, 837, 359/237, 247, 259, 263, 275
See application file for complete search history.

(56) References Cited

U.S. PATENT DOCUMENTS

| | | | |
|---|---|---|---|
| 6,445,470 B1 * | 9/2002 | Jenkins et al. ............... 359/11 |
| 6,491,396 B2 * | 12/2002 | Karasawa et al. ............. 353/20 |
| 7,084,960 B2 * | 8/2006 | Schenker et al. .............. 355/71 |
| 7,318,644 B2 * | 1/2008 | Abu-Ageel .................. 353/20 |
| 7,368,744 B2 * | 5/2008 | Mulkens ................. 250/504 R |
| 7,405,414 B2 * | 7/2008 | Sandstrom ............ 250/492.22 |
| 7,469,058 B2 * | 12/2008 | Latypov et al. ............. 382/144 |
| 7,520,626 B2 * | 4/2009 | Baba-Ali ..................... 359/850 |
| 7,553,684 B2 * | 6/2009 | Chui et al. .................... 438/31 |
| 2004/0244425 A1 * | 12/2004 | Tong et al. .................... 65/378 |
| 2005/0056929 A1 * | 3/2005 | Ginsburg et al. ............ 257/724 |
| 2005/0172186 A1 * | 8/2005 | Ginsburg et al. ............ 714/724 |
| 2005/0213072 A1 * | 9/2005 | Schenker et al. .............. 355/71 |
| 2005/0286123 A1 * | 12/2005 | Abu-Ageel .................. 359/443 |
| 2006/0018025 A1 * | 1/2006 | Sharon et al. ............... 359/618 |
| 2007/0194254 A1 * | 8/2007 | Hubertus Mulkens ... 250/504 R |
| 2008/0237497 A1 * | 10/2008 | Huggins et al. ........ 250/492.22 |
| 2009/0001169 A1 * | 1/2009 | Vinogradov ........... 235/462.41 |
| 2009/0086184 A1 * | 4/2009 | Coston ......................... 355/67 |
| 2009/0153797 A1 * | 6/2009 | Allon et al. ................. 351/206 |

* cited by examiner

*Primary Examiner*—Bernard E Souw
(74) *Attorney, Agent, or Firm*—Blakely, Sokoloff, Taylor & Zafman LLP

(57) ABSTRACT

The present invention describes a method of conditioning radiation upstream from a reticle including: pixelating the radiation, the pixelating involving partitioning into pixels; modulating a first set of the pixels to configure for openings; modulating a second set of the pixels to outline for specific features of the openings; modulating a third set of the pixels to correct for local non-uniformities; modulating a fourth set of the pixels to compensate for global non-uniformities; and modulating a fifth set of the pixels to establish for gray scale.

34 Claims, 3 Drawing Sheets

PIXELATED MODULATION OF ILLUMINATION PUPIL IMAGE

BACKGROUND OF THE INVENTION

1. Field of the Invention

The present invention relates to a field of semiconductor integrated circuit (IC) manufacturing, and more specifically, to an apparatus for and a method of adjusting and controlling illumination in an imaging system.

2. Discussion of Related Art

Integrated Circuit (IC) devices may be fabricated in and over a substrate, such as a wafer, that may include a semiconductor, such as silicon. Various types of materials may be added to, or removed from, the wafer during processing. The materials may include an insulator, such as silicon oxide, or a conductor, such as copper.

Certain materials may be added onto the wafer by processes, such as physical vapor deposition, chemical vapor deposition, and electroplating. Other materials already on the wafer may be modified by processes, such as thermal processing, oxidation, and ion implantation. Yet other materials also on the wafer may be removed by processes, such as wet etching, dry etching, and chemical mechanical polishing (CMP).

As desired, photolithography may be used so that materials may be added or removed selectively from the wafer. For each layer of the IC device, a pattern of features must be transferred accurately from a mask template onto the wafer. Critical features in the pattern must be printed precisely and uniformly with a desired shape, size, separation, orientation, and location.

In order to satisfy product requirements for performance and reliability, critical parameters of the IC device must be measured during fabrication on the wafer. A critical dimension (CD) refers to a smallest lateral dimension, or width, of a feature or a smallest lateral separation between adjacent features that can be printed with good fidelity. Control of the CD may be compromised if an illumination is not correctly adjusted and properly controlled in an imaging tool used for the photolithography.

Thus, a need exists for an apparatus for and a method of adjusting and controlling illumination in an imaging system.

DETAILED DESCRIPTION OF THE PRESENT INVENTION

Figure 1A:
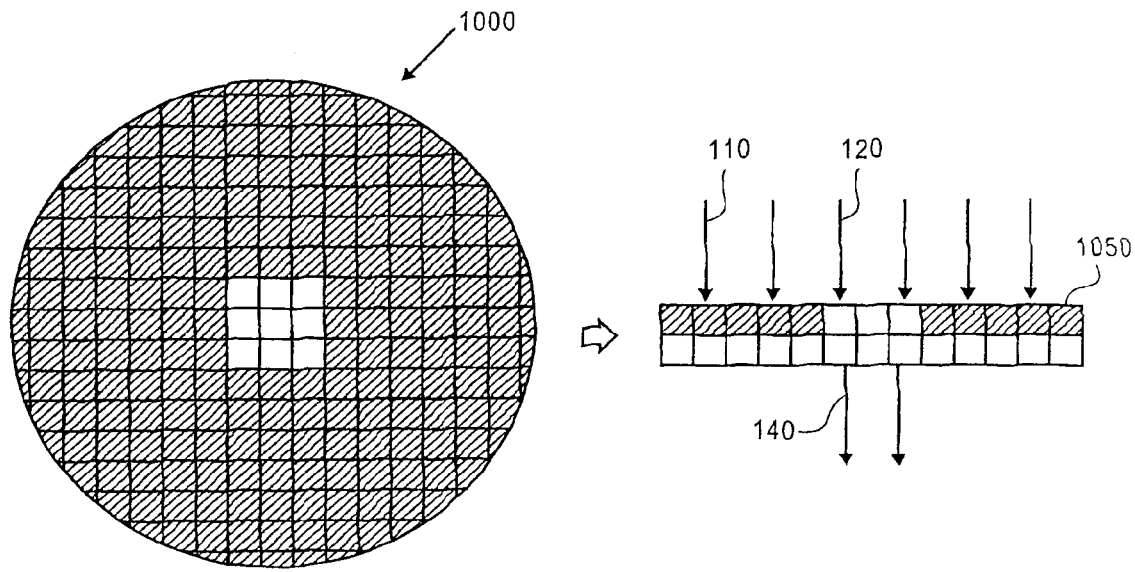
FIG. 1A is an illustration of a transmissive pixelated modulator to form a square aperture at an illumination pupil plane according to an embodiment of the present invention.

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes an apparatus for and a method of adjusting and controlling illumination at a pupil plane in an imaging system.

Patterning of a layer of a substrate, such as a wafer, may include an imaging process, such as photolithography, followed by a transfer process, such as etch. A coating of a radiation-sensitive material, such as a photoresist, may be applied over the wafer, selectively exposed to actinic radiation from a portion of an electromagnetic spectrum, and then developed to form a pattern having features.

The radiation may be produced by a source of illumination in the imaging system. In an embodiment of the present invention, deep ultraviolet (DUV) light with a nominal wavelength of 248 nanometers (nm) or 193 nm may be generated by an excimer laser using an appropriate gas, such as KrF or ArF. In another embodiment of the present invention, extreme ultraviolet (EUV) light with a nominal wavelength selected from a range of 10-15 nm may be generated by a discharge-produced plasma (DPP) or a laser-produced plasma (LPP) using an appropriate gas, such as Xenon or Tin.

An embodiment of the present invention discloses a method of pixelated modulating the radiation that is directed downstream from the source of illumination in a beam along an optical path centered on an optical axis in the imaging system. Downstream in the imaging system refers to an orientation that is pointing away from the source of illumination, along the optical axis, and towards the reticle and the wafer.

In an embodiment of the present invention, a complex pupil point spread function (PSF) of the radiation may be modified spatially or temporally, such as by one or more pixelated modulators at a pupil plane in an imaging system, to enhance resolution or contrast of the features in the pattern to be printed in the photoresist coated over the wafer.

In an embodiment of the present invention, the radiation in the beam may be partitioned, conditioned, and positioned during the pixelated modulating, such as by the one or more pixelated modulators.

In an embodiment of the present invention, the beam of the radiation may be partitioned during the pixelated modulating, such as by the one or more pixelated modulators. Partitioning includes subdividing or separating the beam into smaller beams.

One or more of the smaller beams may also be modulated along the optical path. In an embodiment of the present invention, the smaller beams may be spatially or temporally modulated concurrently, such as in parallel. In an embodiment of the present invention, the smaller beams may be spatially or temporally modulated sequentially, such as in series.

In an embodiment of the present invention, some of the smaller beams may subsequently be entirely recombined. In another embodiment of the present invention, all of the smaller beams may subsequently be partly recombined.

In an embodiment of the present invention, one or more of the smaller beams of the radiation may be conditioned during the pixelated modulating, such as by the one or more pixelated modulators. Conditioning may include modifying or altering a property or parameter of the radiation in the beam. In an embodiment of the present invention, the conditioning may be partially or completely reversible downstream of the pixelated modulators.

As shown in an embodiment of the present invention in FIG. 1A, the pixelated modulation may include adjusting a transmittance of the radiation in the beam at a pupil plane at a location along the optical axis. The pixelated modulating may be performed by a pixelated modulator 1000 that includes pixels 1050 which either block 110 radiation with opaque pixels 1050 or transmit 120 radiation such that only a certain portion 140 continues downstream through what is equivalent to a square central aperture.

Figure 1B:
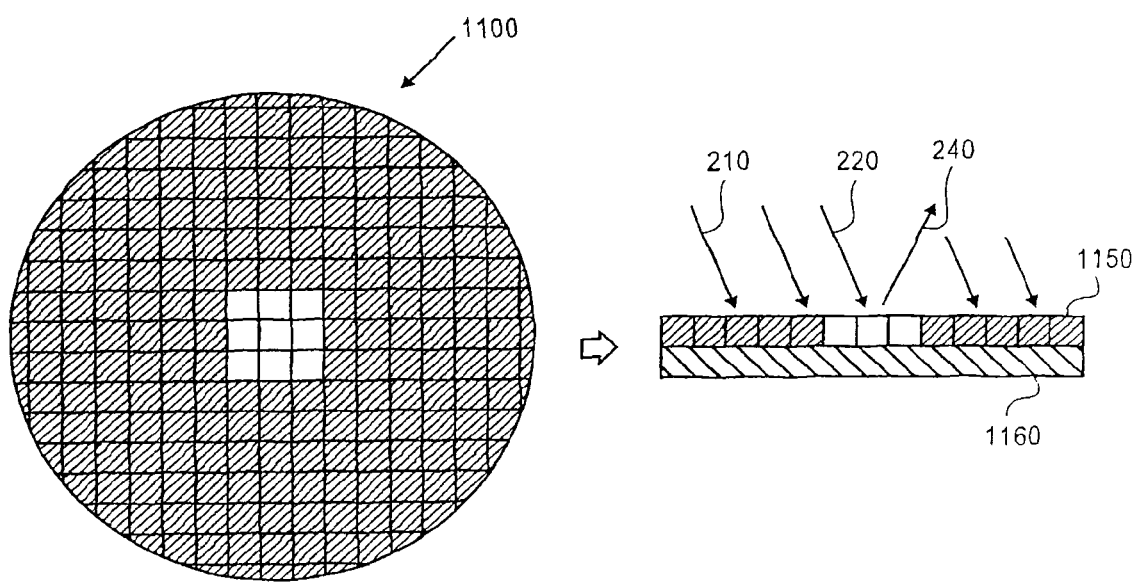
FIG. 1B is an illustration of a reflective pixelated modulator to form a square aperture at an illumination pupil plane according to an embodiment of the present invention.

As shown in another embodiment of the present invention in FIG. 1B, the pixelated modulation may include adjusting a reflectance of the radiation in the beam at a pupil plane at a location along the optical axis. The pixelated modulating may be performed by a pixelated modulator 1100 that includes opaque pixels 1150 which absorb 210 radiation or clear pixels which permit an underlying reflective layer 1160 to reflect 220 radiation such that only a certain portion 240 continues downstream through what is equivalent to a square central aperture.

In still another embodiment of the present invention, the pixelated modulation may include adjusting both the transmittance and the reflectance of the radiation in the beam at a location along the optical axis.

In an embodiment of the present invention, the beam of the radiation may be positioned during the pixelated modulating, such as by the one or more pixelated modulators. Positioning includes redirecting the beam or relocating the radiation.

In an embodiment of the present invention, the modulation of the beam of the radiation may be performed mechanically, optically, electrically, or electronically. The control of the modulation of the beam of radiation may be handled by hardware, software, or a combination of hardware and software.

In an embodiment of the present invention, the pixelated modulating may include: configuring openings of various sizes; outlining specific features; correcting local non-uniformities; compensating for global non-uniformities; and establishing a gray scale.

In an embodiment of the present invention, the pixelated modulating includes outlining for specific features of the pattern. In an embodiment of the present invention, the specific features may correct or compensate for deficiencies in the imaging process that degrade fidelity of the pattern to be printed in the photoresist coated over the wafer. In another embodiment of the present invention, the specific features may correct or compensate for deficiencies in the transfer process that degrade fidelity of the pattern etched in the underlying substrate of the wafer.

Figure 3:
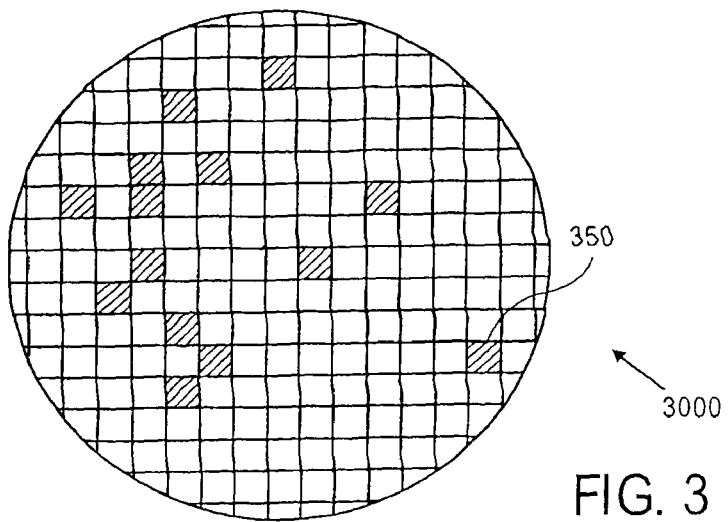
FIG. 3 is an illustration of a spatially pixelated modulator to compensate for local variations in intensity (amplitude) at an illumination pupil plane according to an embodiment of the present invention.

As shown in an embodiment of the present invention in FIG. 3, the pixelated modulating, such as may be performed by a pixelated modulator 3000, includes correcting for local non-uniformities or imperfections. In an embodiment of the present invention, the local non-uniformities may include discrete defects 350. In an embodiment of the present invention, the discrete defects are shown in FIG. 3 as having a uniform size and as being about the same size as a pixel.

In an embodiment of the present invention, the discrete defects may include aberrations in the optics in various modules, whether upstream or downstream in the imaging system.

In an embodiment of the present invention, the pixelated modulating includes compensating for global non-uniformities, gradients, discontinuities, or other imperfections in various parameters of the radiation, such as intensity (amplitude), phase, or polarization. The polarization may be horizontal, vertical, or azimuthal. In an embodiment of the present invention, a first set of pixels may modify the intensity (amplitude), a second set of pixels may modify the phase, and a third set of pixels may modify the polarization.

In an embodiment of the present invention, the pixelated modulating includes establishing a gray scale, such as to compensate for local or global non-uniformities, gradients, discontinuities, or other imperfections.

In an embodiment of the present invention, the gray scale may be implemented spatially (not shown).

Figure 4:
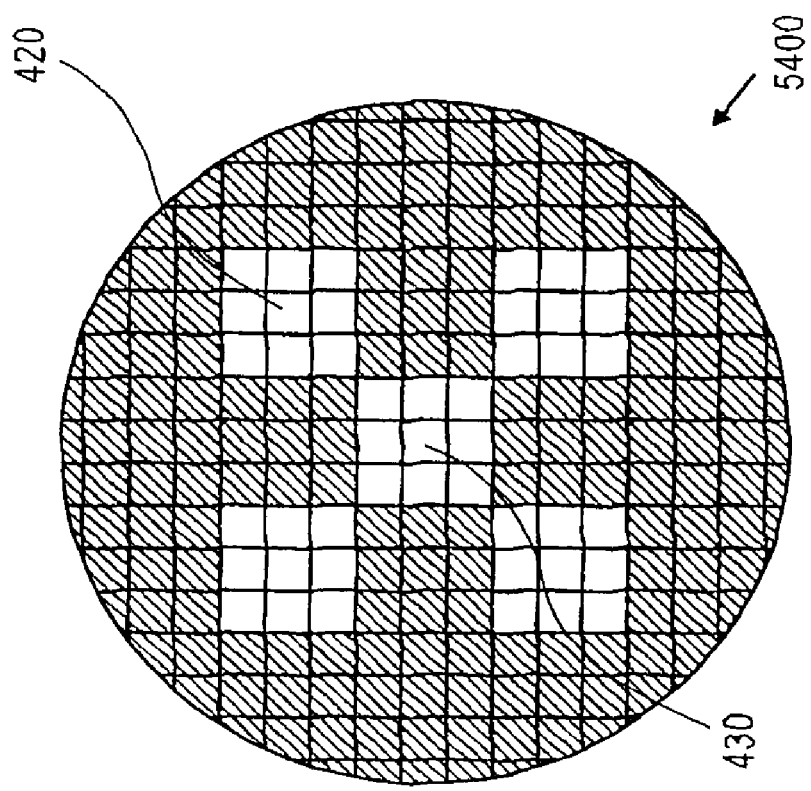
FIG. 4 is an illustration of a temporally pixelated modulator to form gray scale regions by dithering between two spatially modulated states at an illumination pupil plane according to an embodiment of the present invention.
Figure 4:
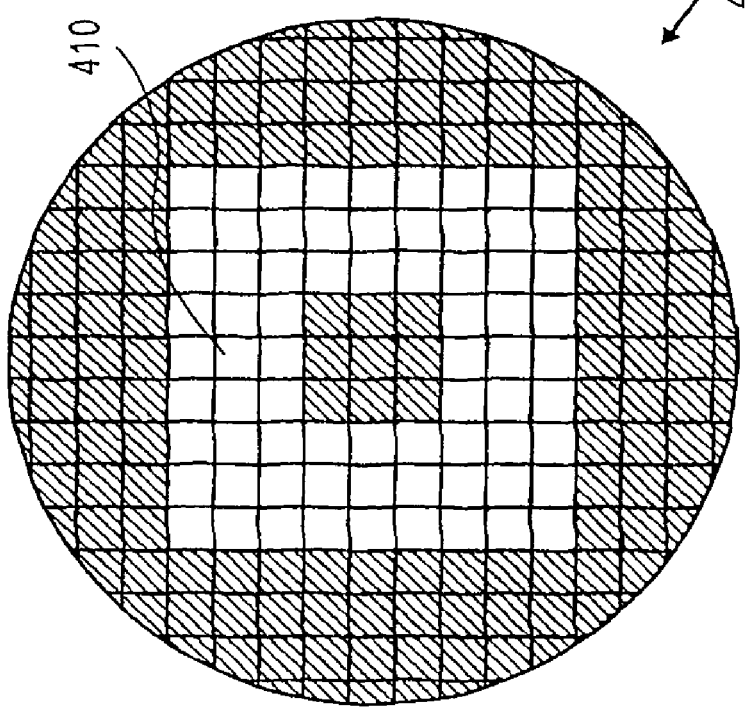

In an embodiment of the present invention, the gray scale may be implemented temporally, such as by switching or dithering between two or more different sets or subsets of pixels. As shown in an embodiment of the present invention in FIG. 4, dithering between a first set 410 of pixels in a first state 4500 (in a first timeframe) and a second set 420 of pixels in a second state 5400 (in a second timeframe) produces the equivalent of a clear opening 420, and the equivalent of a gray opening 410, 430. In particular, FIG. 4 shows a time-modulated hybrid aperture that combines 4 clear off-axis corner openings (quadrupole) 420 with 1 gray on-axis central opening 430.

The projection optics (PO) module transfers the radiation from the reticle module to the wafer module. The PO may be refractive or catadioptric for DUV light and reflective for EUV light. The reticle may be transmissive when the incident radiation includes DUV light. The reticle may be reflective when the incident radiation includes EUV light.

The incident radiation may be transmitted through (120 in FIG. 1A), or reflected by (220 in FIG. 1B), the reticle to define a pattern in the photoresist on the wafer. The pattern may include features for forming the layers of the IC device in the field.

In an embodiment of the present invention, the pattern includes features arranged in a horizontal or x-orientation and a vertical or y-orientation. In another embodiment of the present invention, the pattern includes features arranged in a diagonal (45 degree) layout.

A proximity effect may become significant when the distance or separation between edges of features on the reticle or the wafer approach the wavelength of the radiation. The proximity effect may result in an iso-dense bias, between CD of an isolated feature and CD of a dense, or nested, feature.

In an embodiment of the present invention, the features may be categorized as dense, semi-dense, semi-isolated, and isolated, depending on a duty cycle. The duty cycle refers to a ratio of a linewidth to a space. A dense feature refers to a duty cycle of 1.0:1.0 or smaller (such as 1.0:0.8). A semi-dense feature refers to a duty cycle, of 1.0:1.0-1.0:3.0. A semi-isolated feature refers to a duty cycle of 1.0:3.0-1.0:5.0. An isolated feature refers to a duty cycle of 1.0:5.0 or larger.

As needed, optical proximity correction (OPC) may be used in the design and fabrication of the reticle to further improve the fidelity of the pattern to be subsequently printed with the reticle. The OPC involves the addition of dogbones, hammerheads, serifs, and jogs to certain features in the pattern on the reticle. The OPC may be rule-based, model-based, or a hybrid. Anti-scattering bars may be added near the features.

A set of 15 to 45 reticles may be used to form various layers of the IC device. Most layers require exposure with only a single reticle having design and layout that are specific to the layer. The single reticle may include a binary mask (BIM). The binary mask, such as a chrome-on-glass (COG) reticle, modulates an intensity or amplitude of the incident radiation to produce an aerial image.

For a field effect transistor (FET), certain critical layers, such as isolation, gate, contact, and first metal, of the IC device may include features that require particularly stringent design rules. Consequently, in order to produce a sufficiently small CD, some layers may require exposure with a reticle that may include a phase-shifting mask (PSM). The PSM modulates a phase as well as the amplitude of the radiation to produce the aerial image with improved resolution. The PSM may be a strong PSM or a weak PSM. The types of PSM that may be used include an alternating PSM (AltPSM), an attenuated PSM (AttPSM), and an embedded PSM (ePSM).

Some layers may use multiple exposure with a reticle. In an embodiment of the present invention, the reticle may be shifted laterally (in x, y or theta) between the multiple exposures. In an embodiment of the present invention, the focus may be shifted (in z) between the multiple exposures.

Some layers may also benefit from exposure with multiple reticles, such as gate layer which may use the PSM and a trim reticle. The trim reticle may be used with an etch to further reduce the CD of a feature that has been printed with the PSM.

In other embodiments of the present invention, more elaborate double patterning schemes may be used that include exposing, developing, and etching, one or more times each, and in various order.

When a wafer stepper or a wafer scanner serves as the imaging tool for photolithography, an upper (or front) surface of the wafer may be arranged into contiguous fields. The fields may be organized with a uniform periodicity across the wafer, such as in a rectilinear grid with designated rows and columns. Each field may include one or more dice. A die may include an integrated circuit (IC) device. Neighboring dice may be subsequently separated by dicing along horizontal and vertical scribelines.

After alignment of the reticle and the wafer, the imaging tool may move the wafer stage to predetermined locations to serially expose the fields across the wafer to the actinic radiation from the source of illumination. Exposure of the photoresist to the radiation, as modulated by the reticle, will form a latent image of the pattern in each field.

Next, a post-exposure bake (PEB) of the photoresist over the wafer may be performed. Then, a develop of the photoresist over the wafer will convert the latent image in the photoresist into a developed pattern with features, such as lines, spaces, or holes.

The yield of the IC device, such as a microprocessor, fabricated on the wafer, may depend on the fidelity of the pattern replicated from the reticle into the photoresist coated over the wafer. Consequently, the features in the pattern as printed may be inspected for defects. The defects may include extraneous material, missing material, displaced edges, and distorted shapes.

The CD of the features may be determined, such as with an atomic force microscope (AFM), a confocal microscope, an interferometric microscope, or a scanning electron microscope (SEM). The CD of the features in the pattern may be influenced by a variety of systematic and random factors. One type of effect derives from the interaction of light with topography, film thickness, and reflectivity of the wafer. A second type of effect comes from non-uniformity of the features on the reticle that defines the pattern on the wafer. A third type of effect involves imprecision and inaccuracy of the imaging system to level, focus, align, and expose the wafer to the light. A fourth type of effect results from aberrations in illumination optics and projection optics (PO) of the imaging tool.

The present invention further envisions a tool or system that includes a physical component, element, or characteristic that is adapted for, configured for, or capable of pixelated modulating. In an embodiment of the present invention, the tool or system of the present invention may include one or more pixelated modulators.

In an embodiment of the present invention, the system may include: a source of radiation; collector optics located downstream from the source; shaping optics located downstream from the collector optics; a pixelated modulator located downstream from the shaping optics; relay optics located downstream from the pixelated modulator; condenser optics located downstream from the relay optics; a reticle located downstream from the condenser optics; projection optics located downstream from the reticle; and a substrate located downstream from the projection optics where the substrate may be exposed to radiation emitted from the source.

In an embodiment of the present invention, the pixelated modulator may include: a first set of partially transmissive elements; a second set of partially diffractive elements; and a third set of partially reflective elements.

In an embodiment of the present invention, the pixelated modulator is located at an illumination pupil plane in the system.

In another embodiment of the present invention, the pixels of the pixelated modulator are non-overlapping.

In an embodiment of the present invention, the pixels of the pixelated modulator are contiguous.

In an embodiment of the present invention, the pixels of the pixelated modulator may be clustered physically into sets.

In an embodiment of the present invention, the pixels of the pixelated modulator may be arranged logically into sets.

In an embodiment of the present invention, the pixels of the pixelated modulator may be organized functionally into sets.

In an embodiment of the present invention, the pixels in the sets of the pixelated modulator may be controlled spatially or temporally.

In an embodiment of the present invention, each pixel is only included in one set of pixels. See FIG. 1A, FIG. 1B, FIG. 2A, FIG. 2B.

In another embodiment of the present invention, some pixels may be included in multiple sets of pixels. See FIG. 4.

In an embodiment of the present invention, the pixelated modulation of the radiation in the optical path of the illumination is spatial or a function of location within the cross section of the beam. See FIG. 1A, FIG. 1B, FIG. 2A, FIG. 2B.

In another embodiment of the present invention, the pixelated modulation of the radiation in the optical path of the illumination is temporal or a function of time that has elapsed or transpired. See FIG. 4.

In still another embodiment of the present invention, the pixelated modulation of the radiation in the optical path of the illumination is both spatial and temporal. See FIG. 4.

In an embodiment of the present invention, the pixels in the pixelated modulator may be rapidly configurable.

In an embodiment of the present invention, the pixels in the pixelated modulator may be tuned dynamically, such as during exposure of photoresist coated over a wafer.

In an embodiment of the present invention, various sets of pixels may be switched on and off rapidly, such as with an illumination control device, a certain number of times during exposure of the wafer.

In an embodiment of the present invention, the switching on and off of the various sets of pixels, such as with the illumination control device, may be synchronized with pulses of the laser that generates the radiation in the source.

In an embodiment of the present invention, one or more sets of the pixels may be modulated concurrently, sequentially, alternately, or alternatively by the illumination control unit.

In an embodiment of the present invention, the pixelated modulator includes a first set of pixels configured for openings; a second set of pixels outlined for specific features, such as of the openings; a third set of pixels corrected for local non-uniformities; a fourth set of pixels compensated for global non-uniformities; and a fifth set of pixels established for a gray scale.

In an embodiment of the present invention, all sets of pixels are coplanar, such as distributed across a single pupil plane.

In another embodiment of the present invention, some, but not all, sets of pixels share the same plane, such as the first through the fourth set of pixels are located in a first plane while the fifth set of pixels is located in a second plane.

In still another embodiment of the present invention, each set of pixels is located on a separate plane such that all of the separate planes are located in close proximity along the optical axis.

In yet another embodiment of the present invention, each set of pixels is located on a separate plane, such that the separate planes are located far apart, such as at different pupil planes.

In an embodiment of the present invention, the openings may be small, such as 125-625 microns. In an embodiment of the present invention, the openings may be medium, such as 625-3,125 microns. In an embodiment of the present invention, the openings may be large, such as 3,125-15,625 microns.

Figure 2A:
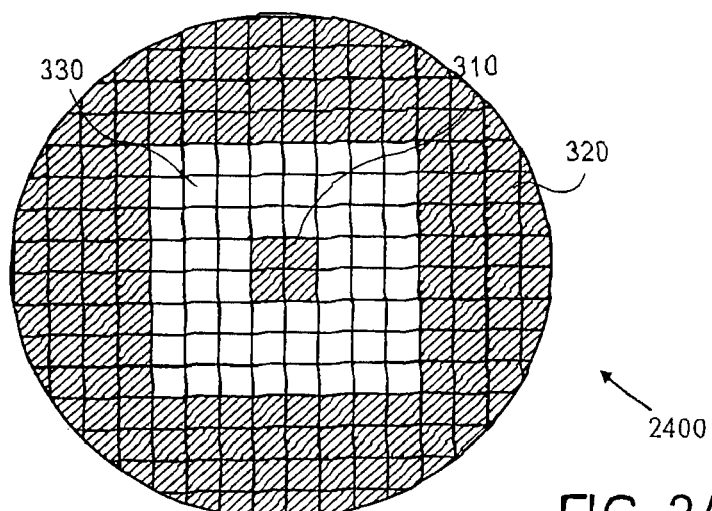
FIG. 2A is an illustration of a pixelated modulator to form a square annular aperture at an illumination pupil plane according to an embodiment of the present invention.
Figure 2B:
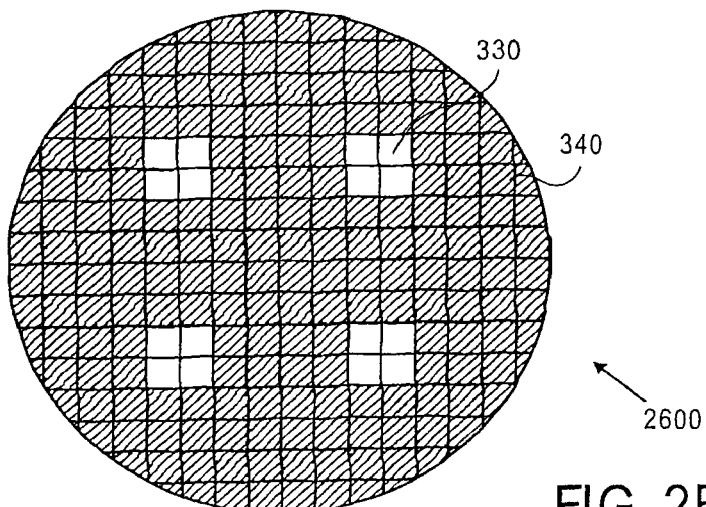
FIG. 2B is an illustration of a pixelated modulator to form square quadrupole apertures at an illumination pupil plane according to an embodiment of the present invention.

In an embodiment of the present invention, the openings may include a central obscuration, such as resulting in an annulus (see FIG. 2A), a dipole (not shown), or a quadrupole (see FIG. 2B). Central may include encircling or surrounding an optical axis.

In various embodiments of the present invention, the specific features may change the size (area) of an opening but not the shape, change the shape of an opening but not the size (area), change both the size (area) and the shape of an opening.

In general, the local non-uniformities in source illumination remain fixed in location and do not vary over time. In an embodiment of the present invention, the local non-uniformities include spatial variation on a scale of 3 pixels or less. In another embodiment of the present invention, the local non-uniformities include spatial variation on the scale of 3-7 pixels. In still another embodiment of the present invention, the local non-uniformities include spatial variation on the scale of 7-18 pixels.

In general, the global non-uniformities in source illumination change in location and vary over time. The global non-uniformities in source illumination may include spatial variation on a scale of over 18 pixels. The global non-uniformities in source illumination may also include temporal fluctuation.

In an embodiment of the present invention, the gray scale may configure or simulate an off-axis illumination (OAI). See FIG. 4.

In an embodiment of the present invention, the gray scale may enhance optical proximity correction (OPC), such as on the reticle.

In an embodiment of the present invention, the gray scale may enhance phase-shifting, such as on the reticle.

In an embodiment of the present invention, the first or second set of pixels may include pixels that are rectangles that are adjacent where a shorter side and a longer side may include dimensions selected from a range of 125.0-625.0 microns.

In an embodiment of the present invention, the first or second set of pixels may include pixels that are regular pentagons that are adjacent where the edges include dimensions selected from a range of 5.0-25.0 microns.

In an embodiment of the present invention, the first or second set of pixels may include pixels that are regular hexagons that are adjacent where the edges include dimensions selected from a range of 0.2-1.0 micron.

In an embodiment of the present invention, the first or second set of pixels includes transmissive liquid crystal displays with variable opaqueness and variable polarities.

In an embodiment of the present invention, the first or second set of pixels includes reflective liquid crystal displays with variable opaqueness and variable polarities.

In an embodiment of the present invention, the first or second set of pixels includes micro-mirrors with variable reflectivities and variable angles of inclination.

In an embodiment of the present invention, the first or second set of pixels includes apertures with adjustable width.

In an embodiment of the present invention, the first or second set of pixels includes apertures with variable width.

In an embodiment of the present invention, the pixelated modulator may include a combination of mechanical, optical, electrical, and electronic components.

The mechanical components may include slits, apertures, blinds, and stops.

The optical components may include lenses, mirrors, waveguides, collimators, attenuators, retarders, fractional (such as a quarter or a half) wave-plates, rotators, polarizers, phase-shifters, beam-splitters, fly's eyes, and gratings. The optical components may be refractive or catadioptric for DUV light and reflective for EUV light.

The electrical components may include power supplies, motors, solenoids, sensors, switches, and actuators.

The electronic components may include resistors, diodes, rectifiers, capacitors, inductors, and transistors.

The various components may be discrete, connected, or integrated, such as in electromechanical or electro-optical sub-systems or sub-assemblies.

The imaging system may include various modules, such as a beam shaper (or magnifier) module, an integrator module, a relay module, a condenser (or focuser) module, a reticle stage module, a projection optics (or reducer) module, and a wafer stage module.

In an embodiment of the present invention, a pixelated modulator located in the imaging system may be structurally embedded within the modules. In another embodiment of the present invention, the pixelated modulator located in the imaging system may be structurally distinct from the modules.

In an embodiment of the present invention, the pixelated modulator may be interposed at or near a pupil plane. In an embodiment of the present invention, the pupil plane may be located between the source and the beam shaper module. In an embodiment of the present invention, the pupil plane may be located between the integrator module and the relay module. In an embodiment of the present invention, the pupil plane may be located between the relay module and the condenser module. In an embodiment of the present invention, the pupil plane may be located between the condenser module and the reticle stage module.

In another embodiment of the present invention, the pixelated modulator may operate as an integral part of a module.

In another embodiment of the present invention, the pixelated modulator may operate independently of the modules.

In an embodiment of the present invention, one or more pixelated modulators may be placed in a carousel or turret in the imaging tool. The carousel or turret may be indexed and rotated. As desired, the one or more pixelated modulators may be positioned in or near the optical path of the illumination. A selection or exchange of the pixelated modulators may be communicated to an illumination control unit through a user interface. The illumination control unit may include a combination of hardware and software.

In an embodiment of the present invention, the pixels in the pixelated modulator may be addressed, such as in a matrix, by the illumination control unit.

In an embodiment of the present invention, the pixels in the pixelated modulator may be programmed, such as in an array, through the user interface.

In an embodiment of the present invention, the first set of the pixels serves as an aperture stop. In an embodiment of the present invention, the first set of the pixels may define a peripheral limit or outer boundary of the cross section of the beam of radiation or exposure light.

In an embodiment of the present invention, the pixelated modulator may adjust and control a numerical aperture (NA). The NA is a measure of a divergence angle of light in the imaging tool. The NA may be varied by changing the size of the aperture stop, such as at the pupil plane of the condenser module or the relay module.

In an embodiment of the present invention, the NA may be 0.55-0.75 for conventional or dry photolithography. In another embodiment of the present invention, the NA may be 0.75-0.95 for the dry photolithography.

In an embodiment of the present invention, the NA may be 0.85-1.25 for immersion or wet photolithography. In another embodiment of the present invention, the NA may be 1.25-1.65 for the wet photolithography.

In an embodiment of the present invention, the first set of the pixels serves as a masking aperture. In an embodiment of the present invention, the first set of the pixels defines a shape and size of the cross section of the beam of radiation or exposure light. In an embodiment of the present invention, the pixelated modulator defines a single opening. In an embodiment of the present invention, the single opening may be positioned off-center from the optical axis.

In an embodiment of the present invention, the pixelated modulator serves as an aperture with an adjustable shape and size.

In an embodiment of the present invention, the pixelated modulator defines a circular aperture that completely fills the pupil of the condenser module. The circular aperture has no orientation or directional dependency and permits the maximum amount of light to progress downstream.

In an embodiment of the present invention, the pixelated modulator defines a square aperture. In an embodiment of the present invention, the square aperture may be transmissive. See FIG. 1A. In an embodiment of the present invention, the transmissivity may be partial, such as 95-99%.

In another embodiment of the present invention, the square aperture may be reflective. See FIG. 1B. In an embodiment of the present invention, the reflectivity may be partial, such as 88-96% for a single layer mirror, such as a metal or alloy layer. In an embodiment of the present invention, the reflectivity may be partial, such as 60-76% for a multilayer mirror, such as a Bragg reflector.

In an embodiment of the present invention, the aperture may be designed with one or more internal obscuration 310 to remove a portion of incident light that may not be desired for printing the features in the pattern. See FIG. 2A and FIG. 2B.

In an embodiment of the present invention, a pixelated modulator with a central obscuration 310 will prevent zeroth-order (on-axis) light from passing straight through. See FIG. 2A and FIG. 2B. In an embodiment of the present invention, the central obscuration may include 2-30% of the maximum cross-sectional area. In an embodiment of the present invention, the central obscuration may include 8-16% of the maximum cross-sectional area.

In an embodiment of the present invention, printing of an isolated feature in the pattern may be improved with on-axis illumination (without any central obscuration) for which many orders of diffracted light are gathered and combined, whether constructively or destructively. On-axis illumination (at a normal angle or 90 degrees) maximizes intensity of light that is transmitted.

In an embodiment of the present invention, the method may include configuring one or more large openings, such as for simulating an off-axis illumination (OAI). See FIG. 2A and FIG. 2B.

In an embodiment of the present invention, printing of a dense feature in the pattern may be improved by off-axis illumination (with central obscuration) for which fewer orders of diffracted light are gathered and combined as the pitch is reduced. Off-axis illumination (at an oblique angle) may result in a lower intensity. However, the pixelated modulator may select oblique angles to permit at least a first order of diffracted light to be gathered. The higher orders of diffracted light, such as first order and second order, improve fidelity of the pattern that is printed in the photoresist.

In an embodiment of the present invention, the pixelated modulator defines a round, or circular, opening with a round, or circular, central obscuration, such as an annulus.

In an embodiment of the present invention, the pixelated modulator defines a square aperture 330 with a square central obscuration 310. See FIG. 2A.

In an embodiment of the present invention, the pixelated modulator defines multiple openings that are off-center, thus including central obscuration. In an embodiment of the present invention, the off-center openings 330 are located symmetrically around the optical axis, such as in a quadrupole. See FIG. 2B.

In another embodiment of the present invention, the pixelated modulator defines one or more slots that are off-center, thus including central obscuration. A slot is an opening that is long and narrow. In an embodiment of the present invention, the slots have different dimensions. The range of oblique angles permitted through a slot becomes tighter (which is more desirable) as the slot becomes narrower. However, the flux of the light also decreases (which is less desirable) as the slot becomes narrower.

The within-field CD variability may include a horizontal-vertical (H-V) bias. In an embodiment of the present invention, a horizontal orientation and a vertical orientation refers to two orthogonal orientations. In an embodiment of the present invention, the horizontal orientation refers to the x-axis and the vertical orientation refers to the y-axis.

The H-V bias may involve CD variability that may be related to a presence of aberrations in various modules, such as the projection optics module. In an embodiment of the present invention, the aberrations may result in a localized effect on the phase of the exposure light.

The primary aberrations include defocus, astigmatism, coma, and spherical. Defocus includes the Zernike circle polynomial $Z_4$. Astigmatism includes the Zernike circle polynomials $Z_5$ and $Z_6$. Coma includes the Zernike circle polynomials $Z_7$ and $Z_8$. Spherical includes the Zernike circle polynomial $Z_9$. Wavefront tilt includes Zernike circle polynomials $Z_2$ and $Z_3$. Other higher-order aberrations may also exist, including some which may be correctable.

Printing in the presence of aberrations that are non-radially symmetric, such as astigmatism, coma, and wavefront tilt, will be improved by on-axis illumination (without any central obscuration). See FIG. 1A and FIG. 1B.

Printing in the presence of aberrations that are radially-symmetric, such as defocus and spherical, will be improved by off-axis illumination (with central obscuration). See FIG. 2A and FIG. 2B.

In some cases, printing will be improved by mixing, blending, or combining on-axis illumination with off-axis illumination, such as with gray scale. See FIG. 4.

The H-V bias may also involve CD variability that may be related to non-uniformity in partial coherence between the horizontal orientation and the vertical orientation. The partial coherence, or sigma, of light in the imaging tool refers to a ratio of the NA of illumination optics divided by the NA of projection optics.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

We claim:

1. A method of conditioning radiation upstream from a reticle comprising:
   pixelating said radiation, said pixelating involving partitioning into pixels;
   modulating a first set of said pixels to configure for openings;
   modulating a second set of said pixels to outline for specific features of said openings;
   modulating a third set of said pixels to correct for local non-uniformities;
   modulating a fourth set of said pixels to compensate for global non-uniformities; and
   modulating a fifth set of said pixels to establish for gray scale.

2. The method of claim 1 wherein said modulating comprises adjusting a transmittance.

3. The method of claim 1 wherein said modulating comprises adjusting a reflectance.

4. The method of claim 1 wherein said modulating is temporal as well as spatial.

5. The method of claim 1 wherein said to configure for openings comprises to configure for off-axis illumination (OAI).

6. The method of claim 1 wherein to outline for specific features comprises to compensate for aberrations.

7. The method of claim 1 wherein to correct for local non-uniformities comprises to correct for discrete defects.

8. The method of claim 1 wherein to compensate for global non-uniformities comprises to compensate for intensity variations.

9. The method of claim 1 wherein to establish for gray scale comprises to establish for horizontal-vertical bias or isolated-nested bias.

10. An array of optical elements disposed at an illumination pupil plane comprising:
    a first set of pixels configured for openings;
    a second set of pixels outlined for specific features of said openings;
    a third set of pixels corrected for local non-uniformities;
    a fourth set of pixels compensated for global non-uniformities; and
    a fifth set of pixels established for gray scale.

11. The array of claim 10 wherein said first set through said fourth set of pixels are disposed in a first plane while said fifth set of pixels is disposed in a second plane.

12. The array of claim 10 wherein said large openings comprise a quadrupole.

13. The array of claim 10 wherein said large openings comprise an annulus.

14. The array of claim 10 wherein said large openings comprise central obstruction.

15. The array of claim 10 wherein said specific features change area but not shape of said openings.

16. The array of claim 10 wherein said specific features change shape but not area of said openings.

17. The array of claim 10 wherein said specific features change both area and shape of said openings.

18. The array of claim 10 wherein said local non-uniformities remain fixed in location.

19. The array of claim 10 wherein said local non-uniformities do not vary over time.

20. The array of claim 10 wherein said local non-uniformities comprise spatial variation on a scale of 7-18 pixels.

21. The array of claim 10 wherein said global non-uniformities change in location.

22. The array of claim 10 wherein said global non-uniformities vary over time.

23. The array of claim 10 wherein said global non-uniformities comprise spatial variation on a scale of over 18 pixels.

24. The array of claim 10 wherein said gray scale comprises off-axis illumination (OAI).

25. The array of claim 10 wherein said gray scale may enhance optical proximity correction (OPC).

26. The array of claim 10 wherein said gray scale may enhance phase-shifting.

27. A system for exposure to radiation comprising:
    a source of radiation;
    collector optics disposed downstream from said source;
    shaping optics disposed downstream from said collector optics;
    a pixelated modulator disposed downstream from said shaping optics, said pixelated modulator comprising:
        a first set of elements disposed proximate said shaping optics, said first set comprising partially transmissive elements or partially reflective elements; and
        a second set of elements disposed distal said shaping optics, said second set comprising partially diffractive elements;
    relay optics disposed downstream from said pixelated modulator;
    condenser optics disposed downstream from said relay optics;
    a reticle disposed downstream from said condenser optics;
    projection optics disposed downstream from said reticle;
    a substrate disposed downstream from said projection optics, said substrate subject to said exposure; and
    a control device to synchronize said pixelated modulator and to switch on and off said first set of elements and said second set of elements multiple times during said exposure.

28. The system of claim 27 wherein said first set comprises rectangles that are adjacent, said rectangles having a shorter side and a longer side wherein the shorter side and the longer side comprise dimensions that are selected from a range of 125.0-625.0 microns (um).

29. The system of claim 27 wherein said first set comprises regular pentagons that are adjacent, said regular pentagons having edges wherein said edges comprise dimensions that are selected from a range of 5.0-25.0 microns (um).

30. The system of claim 27 wherein said second set comprises regular hexagons that are adjacent, said regular hexagons having edges wherein said edges comprise dimensions that are selected from a range of 0.2-1.0 micron (um).

31. The system of claim 27 wherein said first set comprises transmissive liquid crystal displays (LCDs) with variable opaqueness.

32. The system of claim 27 wherein said first set comprises reflective liquid crystal displays (LCDs) with variable opaqueness.

33. The system of claim 27 wherein said first set comprises micro-mirrors with variable angle of inclination.

34. A system for exposure to radiation comprising:
a source of radiation;
collector optics disposed downstream from said source;
shaping optics disposed downstream from said collector optics;
a pixelated modulator disposed downstream from said shaping optics, said pixelated modulator comprising:
a first set of elements disposed proximate said shaping optics, said first set comprising partially transmissive elements or partially reflective elements; and
a second set of elements disposed distal said shaping optics, said second set comprising apertures with adjustable width and partially diffractive elements;
relay optics disposed downstream from said pixelated modulator;
condenser optics disposed downstream from said relay optics;
a reticle disposed downstream from said condenser optics;
projection optics disposed downstream from said reticle; and
a substrate disposed downstream from said projection optics, said substrate subject to said exposure.

* * * * *